United States Patent [19]
Kai et al.

[11] Patent Number: 5,886,372
[45] Date of Patent: Mar. 23, 1999

[54] SEMICONDUCTOR DEVICE HAVING TWO COMPOSITE FIELD EFFECT TRANSISTORS

[75] Inventors: Seiji Kai; Yoshihiro Yamamoto; Masaaki Itoh; Koutarou Tanaka, all of Tokyo, Japan

[73] Assignee: Oki Electric Industry Co., Ltd., Tokyo, Japan

[21] Appl. No.: 888,629

[22] Filed: Jul. 7, 1997

[30] Foreign Application Priority Data

Jul. 8, 1996 [JP] Japan ................................. 8-177864

[51] Int. Cl.⁶ ..................................................... H01L 29/80
[52] U.S. Cl. ......................... 257/275; 257/287; 257/341
[58] Field of Search ................................. 257/287, 331, 257/341, 275, 728; 330/307

[56] References Cited

U.S. PATENT DOCUMENTS

| | | | |
|---|---|---|---|
| 4,837,530 | 6/1989 | Kondoh | 333/81 A |
| 5,633,517 | 5/1997 | Saitoh | 257/277 |

FOREIGN PATENT DOCUMENTS 0 637 844 A2   2/1995   European Pat. Off. .

*Primary Examiner*—Valencia Martin-Wallace
*Assistant Examiner*—George C. Eckert, II
*Attorney, Agent, or Firm*—Rabin & Champagne,P.C.

[57] ABSTRACT

It is an object of the present invention to provide a semiconductor device that is able to have the same Vp in all FETs formed on one chip.

A semiconductor device of the present invention comprises a semiconductor substrate having a first region and a second region on a main surface; a first field effect transistor formed on the first region of the main surface, the first field effect transistor having first gates arranged in a plurality of rows and having a first total gate width, the first gates respectively establishing a first gate length and a first gate width; and a second field effect transistor formed on the second region of the main surface, the second field effect transistor having second gates arranged a plurality of rows and having a second total gate width smaller than the first total gate width, the second gates respectively establishing a second gate length substantially the same as the first gate length and a second gate width substantially the same as the first gate width.

15 Claims, 2 Drawing Sheets

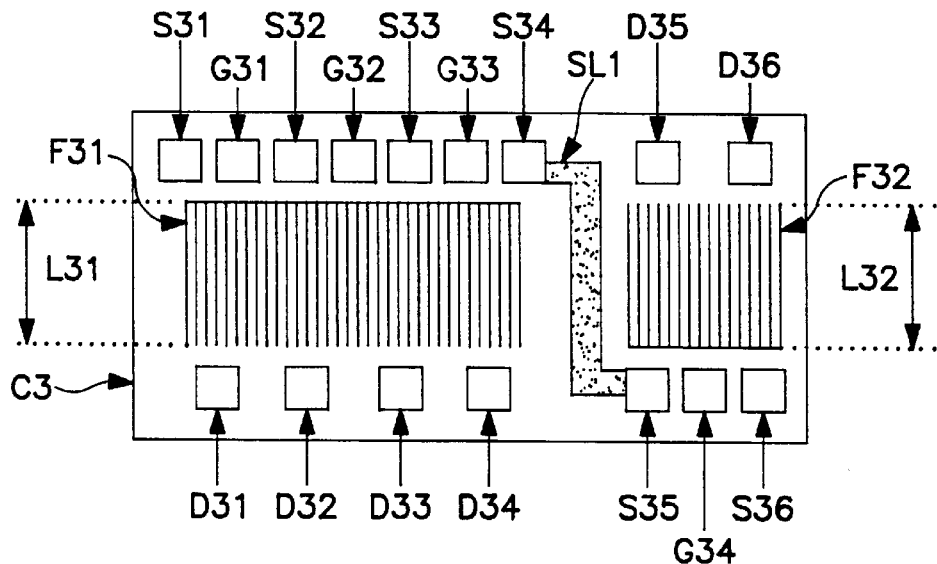
FIG. 3
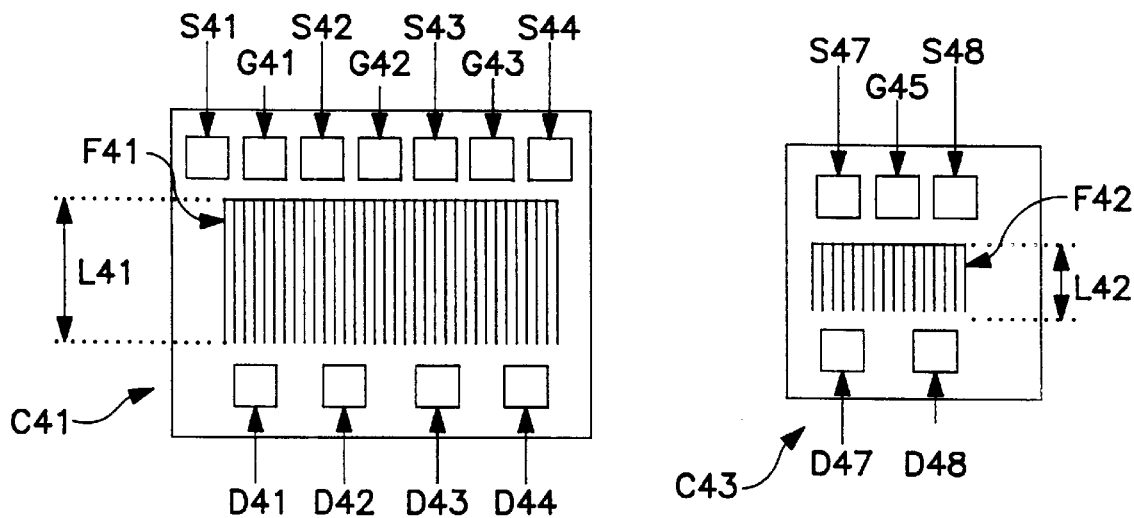
FIG. 4A
PRIOR ART
FIG. 4B
PRIOR ART

SEMICONDUCTOR DEVICE HAVING TWO COMPOSITE FIELD EFFECT TRANSISTORS

CROSS REFERENCE TO RELATED APPLICATION

This application claims the benefit of priority of application Ser. No. 177864/1996, filed Jul. 8, 1996 in Japan, the subject matter of which is incorporated herein by reference.

BACKGROUND OF THE INVENTION

1. Field of the Invention

The present invention relates to a semiconductor device, particularly to a layout of a power field effect transistor (FET).

2. Description of the Related Art

In a conventional semiconductor device, a high power FET and a medium power FET are respectively fabricated as a single-chip discrete device. These are connected together on a circuit substrate. Gate widths of these FETs vary based on utilized frequencies and power supplies. For example, in 900 MHz cellar phones, gate widths of the high power FETs are about 10 mm and gate widths of the medium power FETs are about 3 mm. A gate width usually differs between respective FETs FIG. 4(a) is a plan view showing a high power FET in accordance with the prior art.

FIG. 4(b) is a plane view showing a medium power FET having the same gate width, in accordance with the prior art.

Referring to FIG. 4(a), t-he high power FET comprises a plurality of source pads S41–S44, a plurality of gate pads G41–G43, a plurality of drain pads D41–D44, and a plurality of gates F41, formed on a semiconductor chip C41. An array has the source pads S41–S44 and the gate pads G41–G43 alternately arranged, and they are separated from the drain pads D41–D44, by the gates F41. A gate width of the gates F41 is set to L41.

Referring to FIG. 4(b), the medium power FET comprises a plurality of source pads S47, S48, a gate pad G45, a plurality of drain pads D47, D48, and a plurality of gates F42, formed on a semiconductor chip C43. An array has the source pads S47, S48 and the gate pad G45 arranged alternately, and they are separated from the drain pads D47, D48, by the gates F42. A gate width of the gates F42 is set to L42, which is shorter than L41.

Since the high power FET and the medium power FET, in accordance with the prior art, have respectively different gate widths, a pinch off voltage (Vp) of each O-FET is also respectively different when an implantation condition and a recess condition for forming the conducting layers of the FETs are the same.

SUMMARY OF THE INVENTION

It is an object of the present invention to provide a semiconductor device that is able to have the same Vp in all FETs formed on one chip,. to make it easy to control a process, and to make it easy to construct a control circuit of the FETs.

According to one aspect of the present invention, for achieving the above object, there is provided a semiconductor device, comprising:

a semiconductor substrate having a first region and a second region on a main surface;

a first (composite) field effect transistor formed on the main surface of the first region, the first field effect transistor having first gates arranged in a plurality of rows and having a first total gate width, the first gates respectively having a first gate length and a first gate width; and a second (composite) field effect transistor formed on the main surface of the second region, the second field effect transistor having second gates arranged in a plurality of rows and having a second total gate width smaller than the first total gate width, the second gates respectively having a second gate length substantially the same as the first gate length and a second gate width substantially the same as the first gate width.

According to another aspect of the present invention, for achieving the above object, there is provided a semiconductor device further comprising:

a first plurality of source pads and a first plurality of gate pads commonly connecting between first gates at one side and formed on the main surface close to the commonly connecting portion;

a first plurality of drain pads arranged opposite to the first plurality of source pads and the first plurality of gate pads and formed on the main surface through the first gates;

a second plurality of source pads and a second plurality of gate pads commonly connecting between second gates at one side and formed on the main surface close to the commonly connecting portion; and a second plurality of drain pads arranged opposite to the second plurality of source pads and the second plurality of gate pads and formed on the main surface through the second gates.

According to one aspect of the present invention, for achieving the above object, there is provided a semiconductor device, wherein the source pad, among the first plurality source pads, that is closest to the second plurality of drain pads, is electrically connected to the source pad, among the second plurality of source pads, that is closest to the first plurality of drain pads.

BRIEF DESCRIPTION OF THE DRAWINGS

While the specification concludes with claims particularly pointing out and distinctly claiming the subject matter that is regarded as the invention, the invention, along with the objects, features, and advantages thereof, will be better understood from the following description taken in connection with the accompanying drawings, in which:

FIG. 3 is a plan view showing a semiconductor device according to a third embodiment of the present invention.

FIG. 4a and FIG. 4b are plan views showing power FETs in accordance with the prior art.

DETAILED DESCRIPTION OF THE PREFERRED EMBODIMENTS

A. A first embodiment

A first embodiment of a semiconductor device according to the present invention will hereinafter be described in detail with reference to the accompanying drawings.

Figure 1:
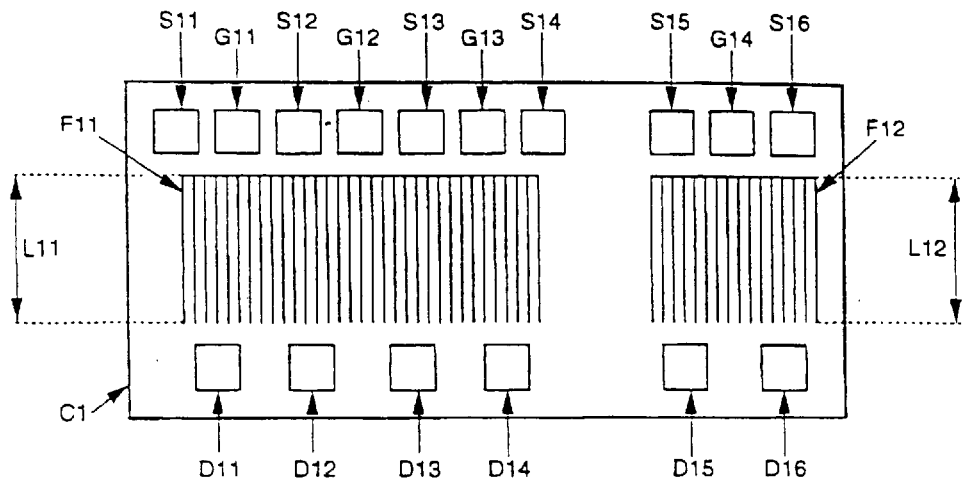
FIG. 1 is a plan view showing a semiconductor device according to a first embodiment of the present invention.

FIG. 1 is a plan view showing a semiconductor device according to a first embodiment of the present invention.

As shown in FIGS. 1, the semiconductor device comprises a composite high power FET and a composite medium power FET. The high power FET and the medium power FET are formed on a semiconductor chip C1.

The high power FET comprises first gate-source pads having a plurality of source pads S11–S14 and a plurality of gate pads G11–G13, a plurality of drain pads D11–D14, and a plurality of gates F11 positioned between the first gate-source pads and the drain pads D11–D14, which are formed on a semiconductor chip C1. The source pads S11–S14 and the gate pads G11–G13 are alternately arranged on the semiconductor chip C1. The gates F11 have a gate width L11. The gates F11 are commonly connected at one end. The gates F11 form a comb-like arrangement. The commonly connected end of the gates is opposite to the first gate-source pads.

Furthermore, the medium power FET comprises second gate-source pads having a plurality of source pads S15, S16 and a gate pad G14, a plurality of drain pads D15, D16, and a plurality of gates F12 positioned between the second gate-source pads and the drain pads D15, D16, which are formed on a semiconductor chip C1. The source pads S15, S16 and the gate pad G14 are alternately arranged on the semiconductor chip C1. The gates F12 have a gate width L12 which is the same as the gate width L11 of the gates F11. The gates F12 are commonly connected at one end. The gates F12 form a comb-type arrangement. The commonly connected portion of the gates is opposite to the second gate-source pads.

Furthermore, the high power FET and the medium power FET are separately arranged. The first gate-source pads, the source pads S15, S16 and the gate pad G14 are formed on one side of the semiconductor chip C1. The drain pads D11–D14 and D15, D16 are formed on the other side of the semiconductor chip C1.

Accordingly, a semiconductor device of the first embodiment of the present invention is able to have the same Vp in all of FETs formed on one-chip.

B. A second embodiment

Figure 2:
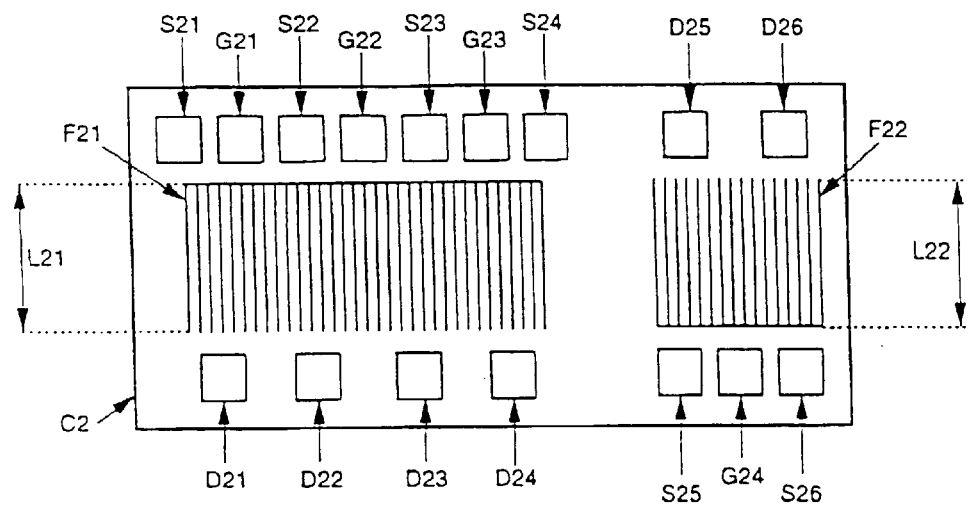
FIG. 2 is a plan view showing a semiconductor device according to a second embodiment of the present invention.

FIG. 2 is a plan view showing a semiconductor device according to a second embodiment of the present invention.

As shown in FIGS. 2, the semiconductor device comprises the high power FET and the medium power FET. The high power FET and the medium power FET are formed on a semiconductor chip C2.

The high power FET comprises first gate-source pads having a plurality of source pads S21–S24 and a plurality of gate pads G21–G23, a plurality of drain pads D21–D24, and a plurality of gates F21 positioned between the first gate-source pads and the drain pads D21–D24, which are formed on a semiconductor chip C2. The source pads S21–S24 and the gate pads G21–G23 are alternately arranged on the semiconductor chip C2. The gates F21 have a gate width L21 and are commonly connected at one end. The gates F21 form a comb-type arrangement. The commonly connected portion is opposite to the first gate-source pads.

Furthermore, the medium power FET comprises second gate-source pads having a plurality of source pads S25, S26 and a gate pad G24, a plurality of drain pads D25, D26, and a plurality of gates F22 positioned between the second gate-source pads and the drain pads D25, D26, which are formed on a semiconductor chip C2. The source pads S25, S26 and the gate pad G24 are alternately arranged on the semiconductor chip C2. The gates F22 have a gate width L22 which is the same as the gate width L21 of the gates F21. The gates F22 are commonly connected at one end, and form a comb type arrangement. The commonly connected portion is opposite to the second gate-source pads.

Furthermore, the high power FET and the medium power FET are separately arranged. The first gate-source pads and the drain pads D25, D26 are formed one side of the semiconductor chip C2. The drain pads D21–D24, the source pads S25, S26 and gate pad G24 are formed on the other side of the semiconductor chip C2.

Accordingly, a semiconductor device of the second embodiment of the present invention is able to have the same Vp in all of FETs formed on one chip, and it is easy to fabricate matching circuits between FETs.

C. A third embodiment

FIG. 3 is a plane view showing a semiconductor device according to a third embodiment of the present invention.

As shown in FIGS. 3, the semiconductor device comprises the high power FET and the medium power FET. The high power FET and the medium power FET are formed on a semiconductor chip C3.

The high power FET comprises a first gate-source pads having a plurality of source pads S31–S34 and a plurality of gate pads G31–G33, a plurality of drain pads D31–D34, and a plurality of gates F31 positioned between the first gate-source pads and the drain pads D31–D34, which are formed on a semiconductor chip C3. The source pads S31–S34 and the gate pads G31–G33 are alternately arranged on the semiconductor chip C3. The gates F31 have a gate width L31 and are commonly connected at one end, forming a comb-type arrangement. The commonly connected portion is opposite to the first gate-source pads.

Furthermore, the medium power FET comprises second gate-source pads having a plurality of source pads S35, S36 and a gate pad G34, a plurality of drain pads D35, D36, and a plurality of gates F32 positioned between the second gate-source pads and the drain pads D35, D36, which are formed on a semiconductor chip C3. The source pads S35, S36 and the gate pad G34 are alternately arranged on the semiconductor chip C3. The gates F31 have a gate width L31 which is the same as the gate width L32 of the gates F32. The gates F32 are commonly connected at one end, and form a comb-type arrangement. The commonly connected portion is opposite to the second gate-source pads.

Furthermore, the high power FET and the medium power FET are separately arranged. The first gate-source pads and the drain pads D35, D36 are formed on one side of the semiconductor chip C3. The drain pads D31–D34, the source pads S35, S36 and gate pad G34 are formed on the other side of the semiconductor chip C3. The source pad S34 is connected with the source pad S35 using a shield pattern SL1.

Accordingly, a semiconductor device of the third embodiment of the present invention is able to have the same Vp in all of FETs formed on one-chip, and is able to isolate and shield between FETs.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device, comprising:
   a substrate;

a first composite field effect transistor, including a plurality of first individual field effect transistors, formed on the substrate, each of the first individual field effect transistors having a gate with the same gate width; and a second composite field effect transistor, including a plurality of second individual field effect transistors, formed on the substrate, each of the second individual field effect transistors including a gate having the same gate width as have the gates of the first individual field effect transistors, a total gate width of the first composite field effect transistor being larger than a total gate width of the second composite field effect transistor.

2. A semiconductor device as claimed in claim 1, further comprising a plurality of first source pads for the first composite field effect transistor, a plurality of second source pads for the second composite field effect transistor, a plurality of first drain pads for the first composite field effect transistor, and a plurality of second drain pads for the second composite field effect transistor, one of the plurality of first source pads being closest to the plurality of second drain pads, one of the plurality of second source pads being closest to the plurality of first drain pads, said one of the plurality of first source pads being electrically connected to said one of the plurality of second source pads.

3. A semiconductor device as claimed in claim 1, wherein
at one side of the first composite field effect transistor connecting ends of the gates of the first individual field effect transistors are commonly connected;
at one side of the second composite field second effect transistor connecting ends of the gates of the second individual field effect transistors are commonly connected; and
the substrate has a first region adjacent to the connecting ends of the gates of the first individual field effect transistors and a second region adjacent to the connecting ends of the gates of the second individual field effect transistors; and
further comprising a plurality of first source pads and a plurality of first gate pads for the first composite field effect transistor on said first region, a plurality of first drain pads for the first composite field effect transistor opposite to the plurality of first source pads, a plurality of second source pads and a plurality of second gate pads for the second composite field effect transistor on said second region, and a plurality of second drain pads for the second composite field effect transistor opposite to the plurality of second source pads.

4. A semiconductor device as claimed in claim 3, wherein one of the plurality of first source pads is closest to the plurality of second drain pads, one of the plurality of second source pads is closest to the plurality of first drain pads, and said one of the plurality of first source pads is electrically connected to said one of the plurality of second source pads.

5. A semiconductor device as claimed in claim 4, further comprising a shield pattern for providing the electrical connection of said one of the plurality of first source pads to said one of the plurality of second source pads.

6. A semiconductor device according to claim 3, wherein the total gate width of the gate of the first composite field effect transistor includes the sum of the gate widths of the first individual field effect transistors, and the total gate width of the gate of the second composite field effect transistor includes the sum of the gate widths of the second individual field effect transistors.

7. A semiconductor device according to claim 1, wherein the total gate width of the gate of the first composite field effect transistor includes the sum of the gate widths of the first individual field effect transistors, and the total gate width of the gate of the second composite field effect transistor includes the sum of the gate widths of the second individual field effect transistors.

8. A semiconductor device according to claim 1, wherein the number of gates of the plurality of first individual field effect transistors is greater than the number of gates of the plurality of second individual field effect transistors.

9. A semiconductor device, comprising:
a substrate;
a first composite field effect transistor, including a plurality of first individual field effect transistors formed on the substrate, each of the first individual field effect transistors having a gate with the same gate width;
a second composite field effect transistor, including a plurality of second individual field effect transistors formed on the substrate, each of the second individual field effect transistors including a gate having the same gate width as have the gates of the first individual field effect transistors, a total gate width of the first composite field effect transistor being larger than a total gate width of the second composite field effect transistor; and
a conductive pattern, including a shield pattern, connecting the first composite field effect transistor and the second composite field effect transistor.

10. A semiconductor device as claimed in claim 9, further comprising a plurality of first source pads for the first composite field effect transistor, a plurality of second source pads for the second composite field effect transistor, a plurality of first drain pads for the first composite field effect transistor, and a plurality of second drain pads for the second composite field effect transistor, one of the plurality of first source pads being closest to the plurality of second drain pads, one of the plurality of second source pads being closest to the plurality of first drain pads, said shield pattern electrically connecting said one of the plurality of first source pads to said one of the plurality of second source pads.

11. A semiconductor device as claimed in claim 9, wherein
at one side of the. first composite field effect transistor connecting ends of the gates of the first individual field effect transistors are commonly connected;
at one side of the second composite field effect transistor connecting ends of the gates of the second individual field effect transistors are commonly connected; and
the substrate has a first region adjacent to the connecting ends of the gates of the first individual field effect transistors and a second region adjacent to the connecting ends of the gates of the second individual field effect transistors; and
further comprising a plurality of first source pads and a plurality of first gate pads for the first composite field effect transistor on said first region, a plurality of first drain pads for the first composite field effect transistor opposite to the plurality of first source pads, a plurality of second source pads and a plurality of second gate pads for the second composite field effect transistor on said second region, and a plurality of second drain pads for the second composite field effect transistor opposite to the plurality of second source pads.

12. A semiconductor device as claimed in claim 11, wherein one of the plurality of first source pads is closest to the plurality of second drain pads, one of the plurality of second source pads is closest to the plurality of first drain pads, and said shield pattern electrically connects said one of the plurality of first source pads to said one of the plurality of second source pads.

13. A semiconductor device according to claim 12, wherein the total gate width of the gate of the first composite field effect transistor includes the sum of the gate widths of the first individual field effect transistors, and the total gate width of the gate of the second composite field effect transistor includes the sum of the gate widths of the second individual field effect transistors.

14. A semiconductor device according to claim 9, wherein the total gate width of the gate of the first composite field effect transistor includes the sum of the gate widths of the first individual field effect transistors, and the total gate width of the gate of the second composite field effect transistor includes the sum of the gate widths of the second individual field effect transistors.

15. A semiconductor device according to claim 9, wherein the number of gates of the plurality of first individual field effect transistors is greater than the number of gates of the plurality of second individual field effect transistors.

* * * * *